United States Patent [19]

Hirano

[11] Patent Number: 5,445,979
[45] Date of Patent: Aug. 29, 1995

[54] METHOD OF MAKING FIELD EFFECT COMPOUND SEMICONDUCTOR DEVICE WITH EAVES ELECTRODE

[75] Inventor: Hidenori Hirano, Yamanashi, Japan

[73] Assignee: Fujitsu Limited, Kawasaki, Japan

[21] Appl. No.: 330,583

[22] Filed: Oct. 28, 1994

[30] Foreign Application Priority Data

Dec. 28, 1993 [JP] Japan .................................. 5-337536

[51] Int. Cl.⁶ ..................... H01L 21/265; H01L 21/28
[52] U.S. Cl. .......................................... 437/41; 437/39;
437/126; 437/133; 437/175; 437/176; 437/184;
437/187; 437/229; 437/912; 437/944;
148/DIG. 100
[58] Field of Search ............... 437/912, 126, 133, 184,
437/11, 41, 39, 229, 944, 187, 175, 176;
148/DIG. 100

[56] References Cited

U.S. PATENT DOCUMENTS

| | | | |
|---|---|---|---|
| 5,116,772 | 5/1992 | Park et al. .............................. | 437/41 |
| 5,139,968 | 8/1992 | Hayase et al. ....................... | 437/176 |
| 5,288,660 | 2/1994 | Hua et al. ............................. | 437/912 |
| 5,385,851 | 1/1995 | Misawa et al. ....................... | 437/184 |

FOREIGN PATENT DOCUMENTS 0370428 5/1990 European Pat. Off. ............. 437/912
0154539 8/1985 Japan .................................... 437/944

OTHER PUBLICATIONS

"IBM Technical Disclosure Bulletin" vol. 29, No. 11, Apr. 1987.

*Primary Examiner*—Olik Chaudhuri
*Assistant Examiner*—Long Pham
*Attorney, Agent, or Firm*—Nikaido, Marmelstein, Murray & Oram

[57] ABSTRACT

A semiconductor device comprises an active layer formed of a compound semiconductor for allowing carriers travel therethrough for exhibiting a function of the device, a protection layer including a non-doped compound semiconductor layer formed on the active layer, a pair of contact holes formed in the protection layer to expose the active layer, and an electrode filling the contact holes and covering the exposed active layer and extending on the protection layer. Generation of notch can be prevented even upon formation of a contact hole in the non-doped compound semiconductor layer and depositing electrode layer thereon.

5 Claims, 6 Drawing Sheets

METHOD OF MAKING FIELD EFFECT COMPOUND SEMICONDUCTOR DEVICE WITH EAVES ELECTRODE

BACKGROUND OF THE INVENTION a) Field of the Invention

The present invention relates to a semiconductor device and more particularly to a field effect semiconductor device comprising a compound semiconductor hereto-junction.

b) Description of the Related Art

A field effect compound semiconductor device which is typically represented by a high electron mobility transistor (HEMT) is a semiconductor device having a high quality with a high speed action, and has been used for such purposes as microwave communication, satellite communication, or the like. Recently, devices of high quality, and high reliability have been demanded, especially of a high efficiency, and high gain.

FIG. 4A shows schematically a fundamental construction of a field effect compound semiconductor device. An active layer 52 formed of an n-type GaAs is formed on an underlying crystal layer 51. The underlying crystal layer 51 is formed by growing, for example, a semi-insulating GaAs buffer film on a semi-insulating GaAs substrate.

Two current electrodes 53s and 53d are formed on an active layer 52 for allowing a current to flow through the active layer 52. Each of these current electrodes 53s and 53d form an ohmic contact with the active layer 52. One of the current electrodes serves as a source electrode 53s and the other serves as a drain electrode.

A gate electrode 56 is formed at a central position between the current electrodes 53s and 53d for controlling the current between the current electrodes. The gate electrode 56 forms a Schottky contact with the active layer 52.

Here, surface of the active layer 52 between the gate electrode 56 and the current electrodes 53s and 53d is passivated by a laminate of a silicon nitride film 54 and a silicon oxide film 55. The insulating laminate also plays a role of separating the gate electrode 56 from the active layer 52.

In this configuration, when a high voltage is applied between the gate electrode 56 and the drain electrode 53d, an electric field is concentrated at an end portion of the gate electrode 56, and a leak current is generated. The active layer 52 undergoes influences by impurity scattering, since it is doped with impurity.

A high electron mobility transistor (HEMT) is constituted by forming the active layer 52 with a non-doped electron traveling layer having a narrow band gap and an electron supply layer having a wide band gap and doped with an n-type impurity. Electrons within the electron supply layer move to the electron traveling layer and, thus, can move at a high speed inside a non-doped crystal having no impurity. Further, a narrow quantum well is formed on the electron traveling layer side of a hetero-junction at an interface between the electron supply layer and the electron traveling layer. The electrons more in the quantum well in the form of a two-dimensional electron gas.

Since gate electrode is separated from electron traveling layer, concentration of electric field at the end point of the gate electrode is moderated. A similar two-dimensional electron gas can be provided even in the case of doping impurities in the electron traveling layer.

A semiconductor device having such a structure also has similar electrode configuration as the metal semiconductor field effect transistor (MESFET) as shown in FIG. 4A. In this specification, such semiconductor devices are also included in the field effect semiconductor device.

In the case of a MESFET, an active layer is a semiconductor layer that plays the role of a channel. In the case of a HEMT, an active layer is a laminate of an electron traveling layer and an electron supply layer.

For obtaining a high quality and a high reliability for a field effect compound semiconductor device, it is preferable to moderate a concentration of electric field at an end portion of a gate electrode. For a high speed action, it is preferable to reduce parasitic capacitance of each electrode. A surface depletion layer formed on the compound semiconductor crystal surface by such cause as an imperfection of crystal, adsorption of metal, oxygen, or the like, will give influence to the inside of the crystal. Thus, for providing a stability of action, surface of the active layer is preferably covered with a passivation film.

FIG. 4B shows schematically a structure of an improved field effect compound semiconductor device. An electron traveling layer 60 formed of a non-doped GaAs layer or an n-type GaAs layer is grown epitaxially on an underlying crystal layer 51. An n-type AlGaAs layer 61 serving as an electron supply layer and as a potential barrier layer is formed epitaxially on the electron traveling layer 60.

Further, a non-doped GaAs layer 62 is grown epitaxially on the electron supply layer 61 as a passivation layer. Surface of an active layer comprising the electron traveling layer 60 and the electron supply layer 61 is released from influences from outside, since it is covered with a protective layer 62 formed of a non-doped GaAs layer.

On the protection layer 62, is further formed a laminate of a silicon nitride film 54 and a silicon oxide film 55. The laminate forms an insulating protective layer.

An aperture is formed through the silicon oxide film 55 and the silicon nitride film 54. An aperture is also formed through the protective layer 62, while aligned with the aperture in the silicon oxide film 55 and the silicon nitride film 54. The surface of the electron supply layer is exposed in the thus formed contact hole.

A gate electrode 56 is formed in such a shape to fill the contact hole exposing the electron supply layer. The gate electrode 56 forms a Schottky contact with the electron supply layer 61.

The insulating protection layers 54 and 55 are also removed from both sides of the gate electrode 56. A source electrode 53s and a drain electrode 53d are formed on a surface of the protection layer 62. The source electrode 53s and the drain electrode 53d are alloyed and form ohmic contact with the electron supply layer 61 and the electron traveling layer 62.

This configuration moderates concentration of electric field at the end portion of gate electrode since the gate electrode is separated from an electron traveling layer 60 by an electron supply layer 61. It further reduces a parasitic capacitance between the gate electrode and the ohmic electrodes 53s and 53d since a surface of the electron supply layer 61 is covered with the protection layer 62 formed of a non-doped GaAs layer. The active layer is relieved from influences of the surface since it is covered with the protection layer 62.

However, this structure separates source electrode 53s and drain electrode 53d from active layer 61 by a protection layer 62. Thus, it becomes difficult to form a good ohmic contact with the active layer.

FIG. 4C shows a structure that can improve quality of ohmic electrodes. In this structure, portions of a protection layer 62 underneath a source electrode 53s and a drain electrode 53d is removed and the source electrode 53s and the drain electrode 53d directly contact an electron supply layer 61. Ohmic characteristic of the source electrode 53s and the drain electrode 53d is improved by eliminating interposition of a non-doped semiconductor layer.

As in the structure shown in FIG. 4B, influences of the surface are reduced at such surface regions of the active region not contacting the electrodes, and being covered with a protection layer 62 of non-doped GaAs.

In the construction as shown in FIG. 4C, ohmic electrodes 53s and 53d are formed as follows. A resist mask having apertures at regions for forming ohmic electrodes is formed. Ohmic electrode layers are deposited by electron beam (EB) deposition, sputtering, or the like. After forming electrode layers, the photo-resist film is removed by alkaline solution and, simultaneously, lift the electrode layers on the photo-resist film off. The step of lifting-off will be described in detail. First, the resist film is removed by a remover comprising orthodichlorbenzene of 55 wt %, phenol of 25 wt % alkylbenzenesulphonic acid of 20 wt % Then after rinsing the substrate with water, acid treatment with hydrochloric acid/water (HCl/H$_2$O=1/10), rinse with water, acid treatment with hydrofluoric acid/ammonium fluoride (HF/NH$_4$F=1/10), and rinse with water are successively performed.

However, in the solution treatment during lift-off step, notches that root into a surface of an active layer are formed by a so-called area effect in a shallow slit formed between the ohmic electrodes 53s and 53d and the protection layer 62. Size of a notch is not uniform because non-uniformity within a plane is so large and reproducibility of the same size is very low. But when a notch 64 is formed, it reduces a current, and thereby, operating characteristic of a semiconductor device is deteriorated.

SUMMARY OF THE INVENTION

An object of the present invention is to provide a semiconductor device which can prevent generation of a notch even upon forming a contact hole in a non-doped compound semiconductor protection layer and forming an ohmic electrode in the contact hole.

Another object of this invention is to provide a method of manufacturing a semiconductor device capable of preventing generation of a notch even upon forming a contact hole in a protection layer and forming an ohmic electrode in the contact hole.

According to one aspect of the present invention, there is provided a semiconductor device comprising an active layer of a ompound semiconductor for allowing carriers to travel therethrough for achieving the function of an element, a protection layer including a non-doped compound semiconductor layer formed on the active layer, a contact hole formed in the protection layer and exposing the active layer, and an ohmic electrode filling the contact hole and covering the exposed active layer and having a peripheral portion extending on the protection layer.

A contact hole is formed in the protection layer including a non-doped compound semiconductor layer to expose an active layer. An electrode is formed to fill the contact hole and to extend on an upper surface of the protection layer. Since no gap is produced between the electrode and the protection layer, no senetration of solution occurs during treatment process. Generation of a notch is thus prevented.

A semiconductor device having such a structure is preferably formed as follows. After patterning a photoresist film to form a resist mask, the resist mask is cured or hardened by an ultraviolet ray. Upper surface of the photoresist mask is hardened by curing. Side surfaces thereof, however, are not so much hardened as the upper surface, due to the downward directivity of the ultraviolet ray. Following an etch of a protection layer for exposing a surface of an active layer, a portion of the photo-resist mask is plasma-treated. The plasma-treatment removes preferentially the side surface that is not hardened so much to, thereby, leave caves of the resist film hanging over an upper part of the protection layer. When an electrode layer is deposited, the electrode that embeds the surface of the active layer extends on an upper surface portion of the protection layer underneath the resist film hanging thereover. Upon lifting off the electrode layer on the resist mask by removing the resist mask, an electrode extending on a surface of the protection layer and not having a gap from the protection layer is provided.

Thus, generation of notch in an underlying layer is prevented when an embedded type electrode is formed.

DESCRIPTION OF THE PREFERRED EMBODIMENTS

Figure 1:
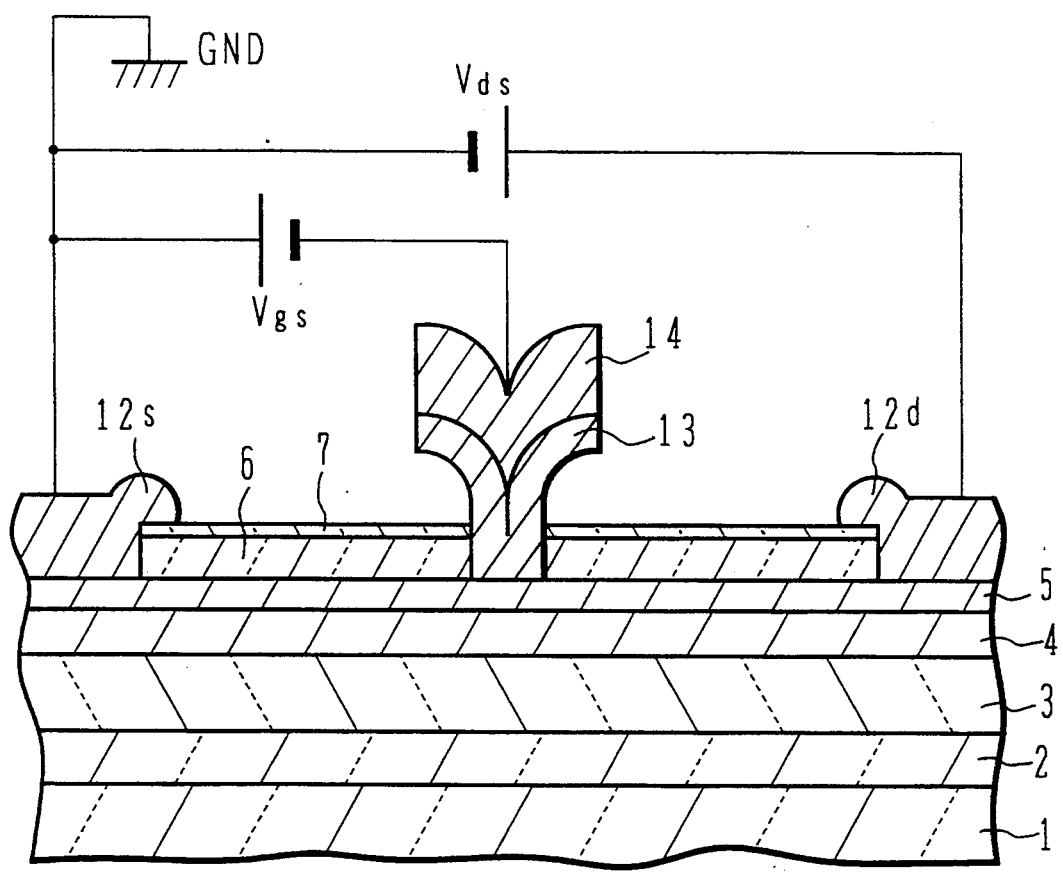
FIG. 1 is a sectional view showing a structure of a field effect semiconductor device according to an embodiment of the present invention.

FIG. 1 shows schematically a structure of a field effect compound semiconductor device according to an embodiment of the present invention. On a surface of a semi-insulating GaAs substrate 1, a buffer layer 2 is formed by growing a non-doped GaAs layer epitaxially to a thickness of approximately 300 nm. On the buffer layer 2, a non-doped Al$_x$Ga$_{1-x}$As layer 3 (with x= 0.3) is grown to a thickness of approximately 500 nm, and an n-type GaAs channel layer 4 doped with Si is grown to have a carrier density of approximately $1.0 \times 10^{16}$ to $1.0 \times 10^{18}$ cm$^{-3}$ and a thickness of approximately 200 nm.

On the channel layer 4, an Al$_x$Ga$_{1-x}$As layer 5 (where x =0.2 to 0.3) is grown to have a carrier density of approximately $1 \times 10^{18}$ cm$^{-3}$ and a thickness of approximately 50 nm. Further thereon, a non-doped GaAs layer 6 is grown epitaxially to a thickness of approximately 200 nm.

The growth of these epitaxial layers can be performed, for example, by molecular beam epitaxy (MBE). Here, other method such as metal organic vapor phase epitaxy (MOVPE) can also be employed.

An $Si_x N_y$ layer 7 (hereafter abbreviated as SiN) is further deposited on the non-doped GaAs layer 6 to a thickness of approximately 50 to 100 nm by plasma enhanced chemical vapor deposition (PE-CVD).

Three contact holes that perforate the SiN layer 7 and the non-doped GaAs layer 6 therebeneath are formed. To a central contact hole, a lower level gate electrode 13 formed of a laminate of WSi/Ti/Au (having thicknesses of 150 nm/8 nm/100 nm, respectively) is formed by vapor deposition, and an upper level gate electrode 14 formed of Au and having a thickness of approximately 300 nm is formed thereon by plating.

On contact holes on both sides of the gate electrode 13 and 14, ohmic electrodes 12, each formed of a laminate of AuGe film/Ni film/Au film (having thicknesses of 35 nm/8 nm/350 nm, respectively), are formed in such way that their circumferential portions extend on the SiN layer 7. Namely, the circumferential or peripheral portions overlap the protection layers 7 and 6. One of the ohmic electrodes, 12s is a source electrode and the other of the ohmic electrodes, 12d is a drain electrode.

The source electrode 12s is connected to ground potential. Gate electrode 13 and 14 is connected to a gate-source bias voltage source Vgs of the negative polarity. A drain electrode 12d is connected to a drain-source bias voltage Vds of the positive polarity.

In this structure, electrons in the n-type AlGaAs layer 5 migrate into the n-type GaAs channel layer 4 having a narrow band gap, thereby to supply electrons thereto. Thus, the n-type AlGaAs layer 5 serves as an electron supply layer. The non-doped GaAs layer 6 covers and protects the surface of the n-type AlGaAs layer 5. The SiN layer 7 further covers and protects the surface of the non-doped GaAs layer 6.

An electric field established around the gate electrode applied with a negative potential rejects electrons in the channel layer 4, to thereby extend a depletion layer. Degree of extension of the depletion layer in the channel layer 4 controls current between the source electrode 12s and the drain electrode 12d.

Here, for performing amplification, a signal voltage is applied to the gate electrode 14. An output signal is taken out of the drain electrode 12d.

The non-doped AlGaAs layer 3 disposed beneath the channel layer 4 forms a potential barrier to carrier electrons because of a wider band gap than the channel layer 4. It, thus, plays a role of defining a channel width.

In this structure, the source electrode 12s and the drain electrode 12d forming ohmic contacts not only contact with the n-type AlGaAs layer 5, but also contact on their sides with the non-doped GaAs layer 6 and further extend on the surface of the SiN layer 7. Therefore, no gap is generated between the source electrode 12s, the drain electrode 12d and the non-doped GaAs layer 6. Generation of notches in such process as lift-off step is effectively prevented in this way.

Hereunder, referring to FIGS. 2A to 2G, manufacturing steps of an electrode are described.

Figure 2A:
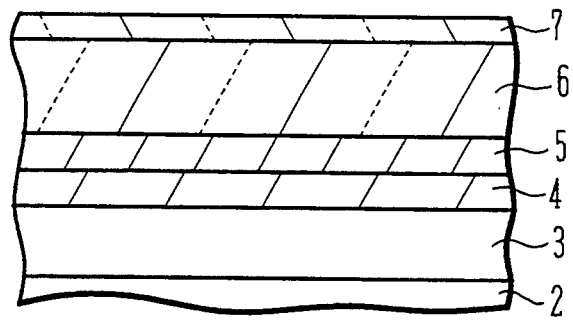
FIGS. 2A to 2G are schematic sectional views for illustrating manufacturing steps according to an embodiment of the present invention.

FIG. 2A shows a step of epitaxial growth. A non-doped AlGaAs layer 3, an n-type GaAs channel layer 4, an n-type AlGaAs electron supply layer 5, and a non-doped GaAs protection layer 6 are successively grown epitaxially on a buffer layer 2 by MBE. Then, an SiN layer 7 is deposited on the surface of the non-doped GaAs layer by plasma enhanced CVD.

Figure 2B:
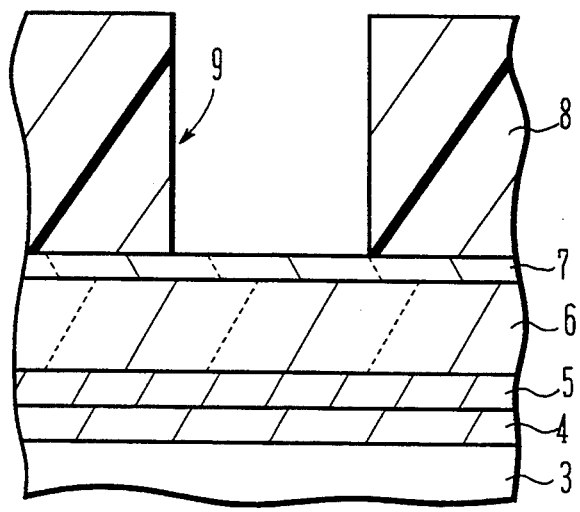

Then, as shown in FIG. 2B, a resist mask 8 is formed by spin-coating first a resist film of novolak resin on the surface of the SiN layer 7 with a thickness of 1.0 to 2.0 μm, and then performing exposure and development. The resist mask has an aperture 9 at each location for forming an ohmic electrode.

Figure 2C:
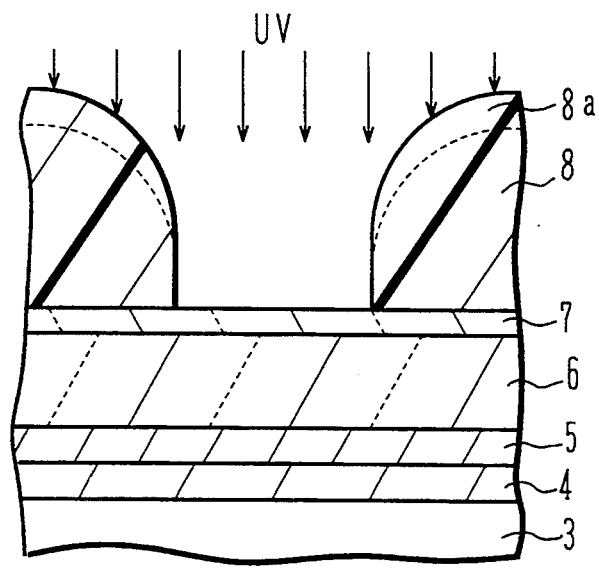

Next, as shown in FIG. 2C, an ultraviolet ray having a wavelength of approximately 365 nm is radiated on the resist mask with a power of approximately 500 W for 100 to 200 seconds. Then, baking at a substrate temperature of 200° C. is performed for 300 seconds. Here, other high energy beam, for example, X-ray beam, electron beam, or the like, can be irradiated in place of the ultraviolet beam.

This process of ultraviolet irradiation and baking provides flow of the resist mask 8 to some extent and curing or hardening of the surface thereof. Cured or hardened portions 8a of the resist mask 8 increases according to the amount of incident ultraviolet beam. The hardened portions 8a, as indicated by broken lines, have a uniform thickness at flat portions, but have a smaller thickness at side surfaces in which the amount of irradiated ultraviolet beam decreases.

Figure 2D:
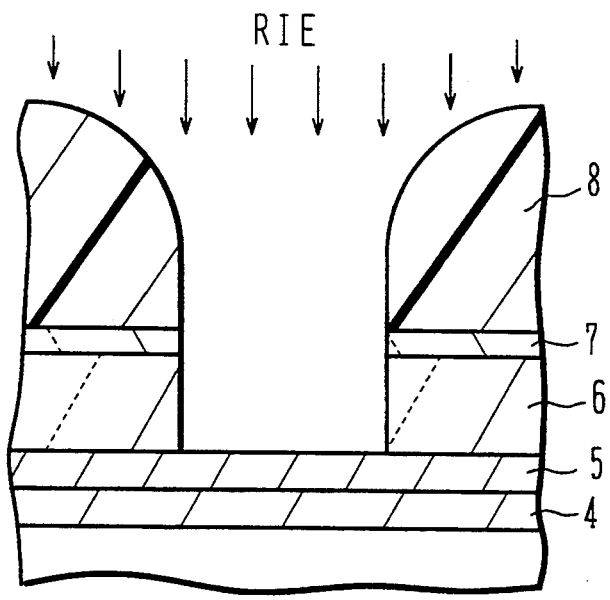

As shown in FIG. 2D, after forming a UV-cured resist mask 8, the exposed SiN layer 7 and the nondoped GaAs layer 6 therebeneath are etched by reactive ion etching (RIE).

RIE is performed by anisotropic etching using parallel plate electrodes. Etching of SiN layer 7 is performed by using a gas of carbon fluoride base as an etchant. Etching of non-doped GaAs layer 6 is performed by using a mixed gas of chlorine base gas and inert gas as an etchant. As a result of RIE, the SiN layer 7 and the non-doped GaAs layer 6 are etched while being aligned to the shape of the resist mask 8.

Figure 2E:
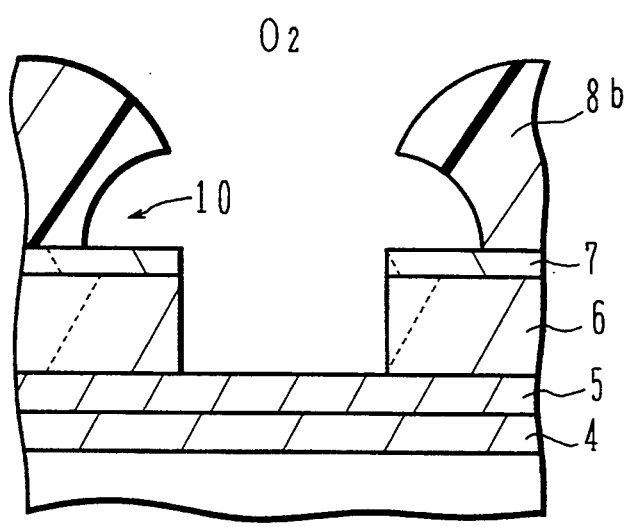

Following the RIE, as shown in FIG. 2E, $O_2$ plasma treatment is performed. The treatment is performed under the conditions of input power of 200 to 500 W and a gas pressure of 0.1 Torr for approximately 10 minutes. As have been described referring to FIG. 2C, the UV-cured surface 8a of the resist mask 8 has a smaller thickness at side surface portion of the aperture. Thus, the resist film on the side surface portion begins to be etched before other part is etched by an $O_2$ plasma treatment.

Accordingly, an overhang or caves 10 is formed at the side surface portion of the aperture. The surface of the SiN layer 7 is exposed under the overhang portion 10 of the resist mask. The $O_2$ plasma treatment is stopped when a desired overhang is formed.

Figure 2F:
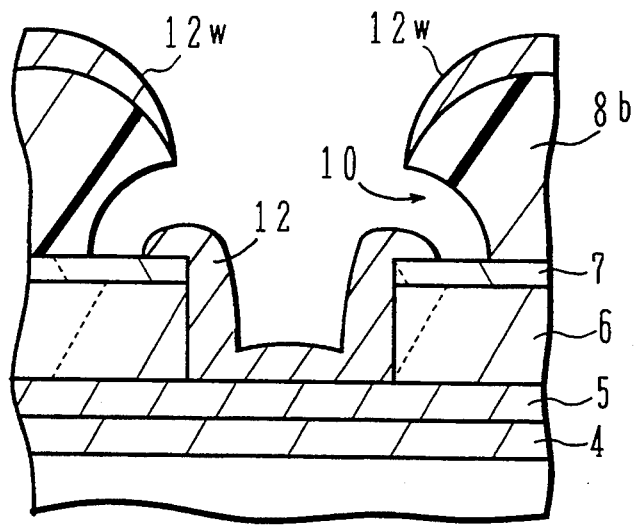

As shown in FIG. 2F, vapor deposition of an ohmic electrode is performed with the resist mask 8b forming the overhang 10. The vapor deposition of an ohmic electrode is performed by holding a semiconductor substrate on a susceptor capable of planetary motion, and using an electron beam (EB) vapor depositing source, sputtering source (target), or the like. Depositing material is incident on the surface uniformly with a certain angle on every direction within the plane of substrate, since the substrate undergoes planetary motion. The electrode 12 on the plane of the SiN layer 7 is formed also under the caves of the resist film hanging over the SiN layer 7 by a slanted incident vapor depositing beam. Consequently, its thickness decreases gradually as the distance from the edge becomes greater.

Accordingly, the ohmic electrode 12 is formed in a shape that covers an exposed surface of the n-type AlGaAs layer 5, climbs the side wall, and covers partially an upper surface of the SiN layer 7. That is to say, the ohmic electrode 12 is formed while self aligning with the resist mask 8b, covering all of the bottom and side surface of the contact hole, and extending on the upper surface of the contact hole.

Thereafter, the resist mask 8b is removed. The removing step of the resist film is performed by, for example, immersing the resist film in alkaline solution, immersing in organic solution, and ultrasonic cleaning or jet injection. Or, it is also performed by treatment with organic solution, immersing in alkaline solution, and immersing in organic solution.

The surface of the AlGaAs layer is never etched by a remover since all the surfaces of the contact hole are covered by the ohmic electrode 12. tiere, an electrode film 12w deposited on a surface of the resist mask 8b is lift off with the resist mask.

Figure 2G:
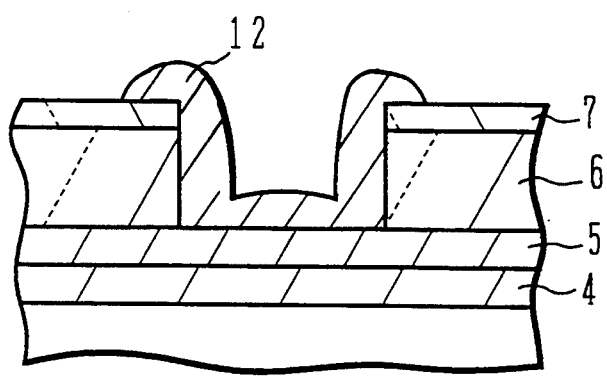

FIG. 2G shows a state where the resist mask 8b is removed. Here, the figures show only a part for forming one ohmic electrode. It will be apparent that a source electrode and a drain electrode can be formed by the same steps.

Here, the electrode forming steps are not limited only to the forming of ohmic electrodes. A gate electrode can be formed by similar steps. Materials of the gate electrode are not limited to WSi/Ti/Au but such material as Al may also be employed.

Figure 3:
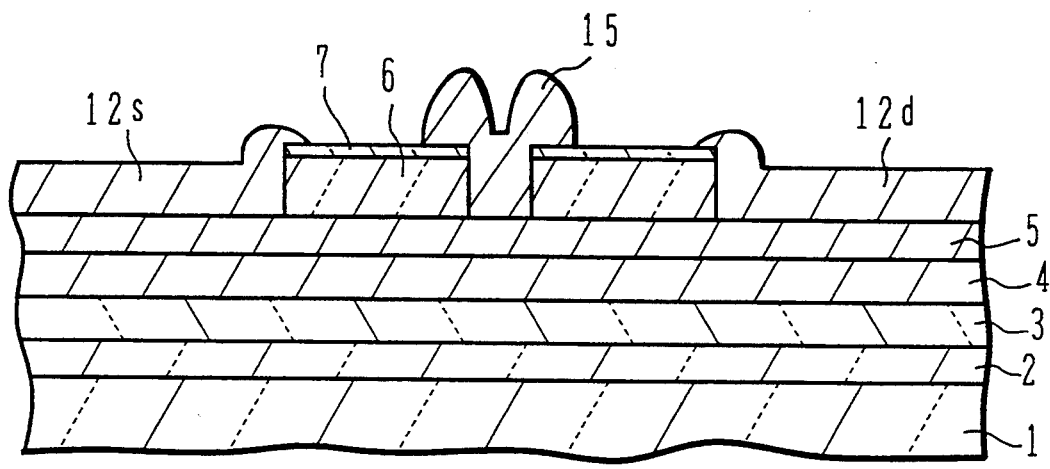
FIG. 3 is a sectional view showing a structure of a field effect semiconductor device according to another embodiment of the present invention.
Figure 4A:
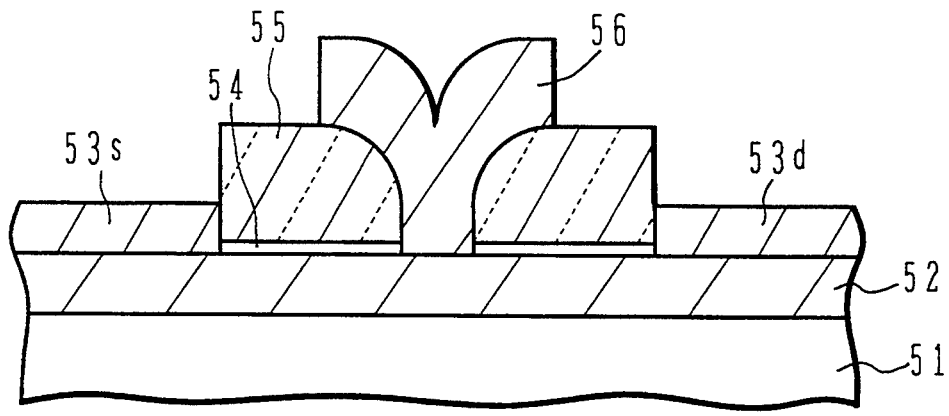
FIGS. 4A to 4C are sectional views showing structures of a field effect semiconductor device according to prior art.
Figure 4B:
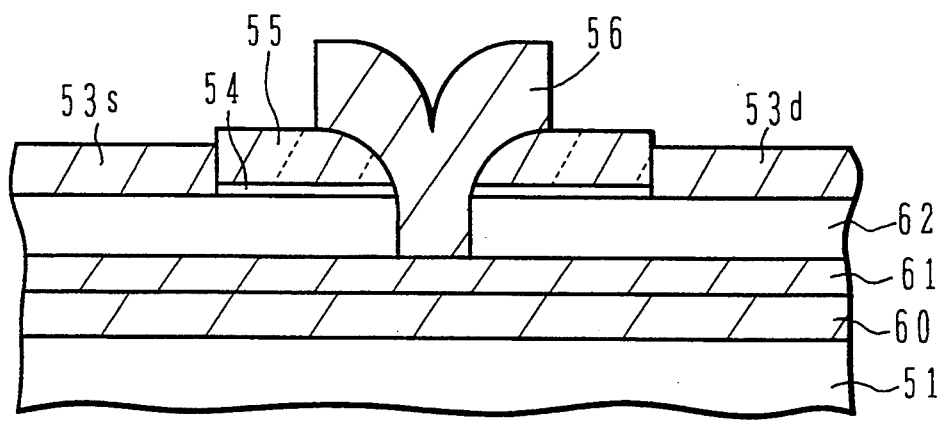
Figure 4C:
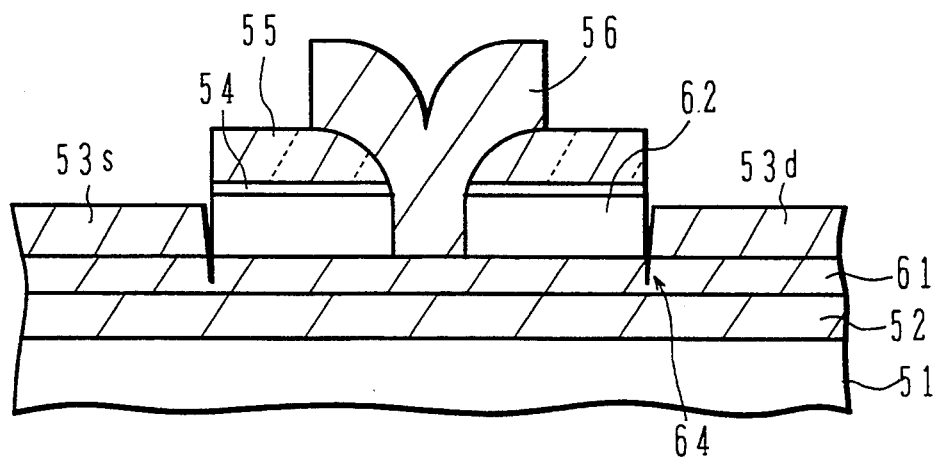

FIG. 3 shows an embodiment wherein all of the source electrode, drain electrode, and gate electrode are formed by the above-described steps.

The structure of epitaxial laminate, on a semi-insulating GaAs substrate 1, of a non-doped AlGaAs buffer layer 2, a non-doped AlGaAs layer 3, an n-type GaAs channel layer 4 an n-type AlGaAs electron supply layer 5 is similar to the case as shown in FIG. 1.

On the surface of the n-type AlGaAs layer 5, a non-doped GaAs protection layer 6 and an SiN insulating layer 7 are laminated. Portions for forming electrodes have contact holes. On these contact holes, ohmic electrodes 12s, 12d and a Schottky gate electrode 15, all of them extending on the protection layers 6 and 7, are formed. tiere, the source electrode 12s and the drain electrode 12d can be formed simultaneously.

According to the abovementioned embodiments, an underlying semiconductor layer is not exposed in the contact hole during the process of lifting off the electrode metal film. Generation of notch in the liftoff step can be prevented.

The present invention has been described along the preferred embodiments. The present invention is not limited to what has been described in embodiments. It will be apparent to those skilled in the art that various changes, substitutes, combinations and improvements can be made within the scope and spirit of the appended claims.

I claim:

1. A method of manufacturing a semiconductor device comprising steps of:
    epitaxially growing an active layer of compound semiconductor for allowing carriers to travel therein, on an underlying crystal body;
    forming a protection layer disposed on said active layer and comprising an undoped compound semiconductor layer, for protecting a surface of said active layer;
    forming a resist film on said protection layer;
    exposing and developing said resist film to form an aperture;
    curing a surface of said resist film anisotropically;
    etching said undoped compound semiconductor layer anisotropically using said resist film as a mask, thereby exposing said active layer;
    subjecting said resist film to oxygen plasma treatment, to partially remove the resist film;
    forming an electrode layer to cover said exposed active layer; and
    removing said resist film and lifting off the electrode layer formed thereon.

2. A method of manufacturing a semiconductor device according to claim 1 wherein said step of forming the protection layer comprises epitaxially growing said undoped compound semiconductor layer, and forming an insulating protection layer thereon, and said step of anisotropic etching etches also said insulating protection layer anisotropically.

3. A method of manufacturing a semiconductor device according to claim 2, wherein said curing step comprises irradiating ultraviolet beam on said resist film from above.

4. A method of manufacturing a semiconductor device according to claim 3, wherein said curing step further comprises heating said resist film simultaneously with said irradiation of ultraviolet beam.

5. A method of manufacturing a semiconductor device according to claim 1, wherein said step of forming an electrode layer is performed while moving the underlying crystal body in a planetary motion approximately in a plane of the body.

* * * * *